(12) United States Patent
Zhu

(10) Patent No.: US 11,329,249 B2
(45) Date of Patent: May 10, 2022

(54) DISPLAY PANEL AND MANUFACTURING METHOD THEREOF

(71) Applicant: WUHAN CHINA STAR OPTOELECTRONICS SEMICONDUCTOR DISPLAY TECHNOLOGY CO., LTD., Wuhan (CN)

(72) Inventor: Zhitao Zhu, Wuhan (CN)

( * ) Notice: Subject to any disclaimer, the term of this patent is extended or adjusted under 35 U.S.C. 154(b) by 208 days.

(21) Appl. No.: 16/645,752

(22) PCT Filed: Nov. 18, 2019

(86) PCT No.: PCT/CN2019/119290
§ 371 (c)(1),
(2) Date: Mar. 9, 2020

(87) PCT Pub. No.: WO2021/036016
PCT Pub. Date: Mar. 4, 2021

(65) Prior Publication Data
US 2022/0052290 A1    Feb. 17, 2022

(30) Foreign Application Priority Data
Aug. 29, 2019 (CN) .......................... 201910805473.1

(51) Int. Cl.
*H01L 51/52* (2006.01)
*H01L 51/00* (2006.01)
*H01L 51/56* (2006.01)

(52) U.S. Cl.
CPC ...... *H01L 51/5246* (2013.01); *H01L 51/0097* (2013.01); *H01L 51/56* (2013.01)

(58) Field of Classification Search
None
See application file for complete search history.

(56) References Cited

U.S. PATENT DOCUMENTS

| 10,637,007 | B1 | 4/2020 | Wang | |
| 10,908,716 | B2* | 2/2021 | Ryu | .................... H01L 51/5253 |
| 2015/0036300 | A1* | 2/2015 | Park | ....................... H05K 1/14 |
| | | | | 361/749 |
| 2016/0174304 | A1* | 6/2016 | Kim | .................... H01L 51/5253 |
| | | | | 313/511 |
| 2018/0011576 | A1* | 1/2018 | Ryu | .................... H01L 51/5253 |
| 2018/0299603 | A1* | 10/2018 | Lee | ....................... G02B 5/3016 |
| 2019/0036075 | A1 | 1/2019 | Jiang | |
| 2019/0051858 | A1* | 2/2019 | Tomioka | ............. H01L 27/3276 |

(Continued)

FOREIGN PATENT DOCUMENTS

| CN | 106847871 A | 6/2017 |
| CN | 108281387 A | 7/2018 |
| CN | 109065589 A | 12/2018 |

*Primary Examiner* — J. E. Schoenholtz
(74) *Attorney, Agent, or Firm* — JMB Davis Ben-David

(57) ABSTRACT

The present disclosure provides a display panel and a manufacturing method thereof. The display panel comprises a flexible substrate and a supporting element. The flexible substrate comprises a main portion, a bonding portion bent on a back surface of the main portion, and a bending portion connected to the main portion and the bonding portion. The supporting element comprises a first supporting portion disposed inside the bending portion and contacting the bending portion, and the first supporting portion is a polyhedron structure.

14 Claims, 2 Drawing Sheets

(56) References Cited

U.S. PATENT DOCUMENTS

| 2019/0094610 A1* | 3/2019 | Yukawa | G02F 1/133308 |
| 2020/0150481 A1* | 5/2020 | You | G02F 1/133308 |
| 2021/0063806 A1* | 3/2021 | Kim | G02F 1/133305 |

* cited by examiner

DISPLAY PANEL AND MANUFACTURING METHOD THEREOF

CROSS-REFERENCE TO RELATED APPLICATIONS

This is the U.S. National Stage of International Patent Application No. PCT/CN2019/119290 filed on Nov. 18, 2019, which in turn claims the benefit of Chinese Patent Application No. 201910805473.1 filed on Aug. 29, 2019, which is incorporated by reference in the present application in its entirety.

FIELD OF INVENTION

The present disclosure relates to the display panel technology field, and more particularly, to a display panel and a manufacturing method thereof.

BACKGROUND OF INVENTION

Along with widespread application of organic light-emitting diode (OLED) technology in display panel industry, a biggest advantage of OLED products is their flexible and foldable characteristics. Current pad bending technology is to bend into a large arc shape with a radius generally ranging from 0.3 mm to 0.5 mm, which can effectively increase a screen ratio of display panels.

However, because a material of a bending region is relatively thin, only about 30 μm, during external force contact, the arc-shaped portion is easily extruded, eventually leading to breakage of internal wirings in the bending region.

SUMMARY OF INVENTION

Embodiments of the present disclosure provide a display panel and a manufacturing method thereof to solve a problem that the bending portion of display panels is easily damaged by extrusion.

The embodiment of the present disclosure provides a display panel comprising a flexible substrate and a supporting element. The flexible substrate comprises a main portion, a bonding portion bent on a back surface of the main portion, and a bending portion connected to the main portion and the bonding portion.

The supporting element comprises a first supporting portion disposed inside the bending portion and contacting the bending portion, and the first supporting portion is a polyhedron structure. An interval is defined between the first supporting portion and the bending portion, and the interval is filled with a sealant.

Furthermore, the supporting element comprises a second supporting portion connected to the first supporting portion, and the second supporting portion is disposed between the main portion and the bonding portion.

Furthermore, the polyhedron structure comprises a hexahedron structure, and the hexahedron structure comprises a top surface, a bottom surface, and four sides respectively connected to the top surface and the bottom surface. The top surface contacts the bending portion, and the bottom surface is connected to the second supporting portion.

Furthermore, the top surface and the bottom surface are rectangular, and the four sides are isosceles trapezoidal.

Furthermore, an included angle between the four sides and the bottom surface ranges from 45° to 60°.

Furthermore, the display panel comprises a backboard, and the backboard is disposed between the main portion and the second supporting portion.

Furthermore, the display panel comprises an organic light-emitting diode (OLED) element, and the OLED device is disposed at a side of the main portion away from the bonding portion.

Furthermore, the display panel comprises a flexible circuit board and a chip on film (COF) substrate, and the flexible circuit board is connected to the bonding portion of the flexible substrate through the COF substrate.

The embodiment of the present disclosure further provides a display panel comprising a flexible substrate and a supporting element. The flexible substrate comprises a main portion, a bonding portion bent on a back surface of the main portion, and a bending portion connected to the main portion and the bonding portion.

The supporting element comprises a first supporting portion disposed inside the bending portion and contacting the bending portion, and the first supporting portion is a polyhedron structure.

Furthermore, the supporting element comprises a second supporting portion connected to the first supporting portion, and the second supporting portion is disposed between the main portion and the bonding portion.

Furthermore, the polyhedron structure comprises a hexahedron structure, and the hexahedron structure comprises a top surface, a bottom surface, and four sides respectively connected to the top surface and the bottom surface. The top surface contacts the bending portion, and the bottom surface is connected to the second supporting portion.

Furthermore, the top surface and the bottom surface are rectangular, and the four sides are isosceles trapezoidal.

Furthermore, an included angle between the four sides and the bottom surface ranges from 45° to 60°.

Furthermore, the display panel comprises a backboard, and the backboard is disposed between the main portion and the second supporting portion.

Furthermore, the display panel comprises an organic light-emitting diode (OLED) element, and the OLED device is disposed at a side of the main portion away from the bonding portion.

Furthermore, the display panel comprises a flexible circuit board and a chip on film (COF) substrate, and the flexible circuit board is connected to the bonding portion of the flexible substrate through the COF substrate.

The embodiment of the present disclosure further provides a manufacturing method of a display panel comprising proving a flexible substrate, wherein the flexible substrate comprises a main portion bending, a bonding portion, and a bending portion connected to the main portion and the bonding portion; disposing a supporting element on a back surface of the flexible substrate, wherein the supporting element comprises a first supporting portion disposed on a back surface of the bending portion, and the first supporting portion is a polyhedron structure; and using the first supporting portion for support, and bending the bending portion to bend the bonding portion to a back surface of the main portion.

Advantageous effects of the present disclosure are that a supporting element is disposed on a back surface of a flexible substrate, and a first supporting portion of the supporting element is disposed inside a bending portion of the flexible substrate and contacts the bending portion. The first supporting portion is a polyhedron structure, so as to support the bending portion when the bending portion is bent, so that the bending portion may be bent in sections.

This prevents damage to the bending portion due to extrusion, thereby effectively protecting the bending portion, while reducing a screen ratio and a thickness of the display panel.

DESCRIPTION OF DRAWINGS

The following detailed description of specific embodiments of the present disclosure will make technical solutions and other advantageous effects of the present disclosure obvious in conjunction with the accompanying drawings.

DETAILED DESCRIPTION OF PREFERRED EMBODIMENTS

Figure 1:
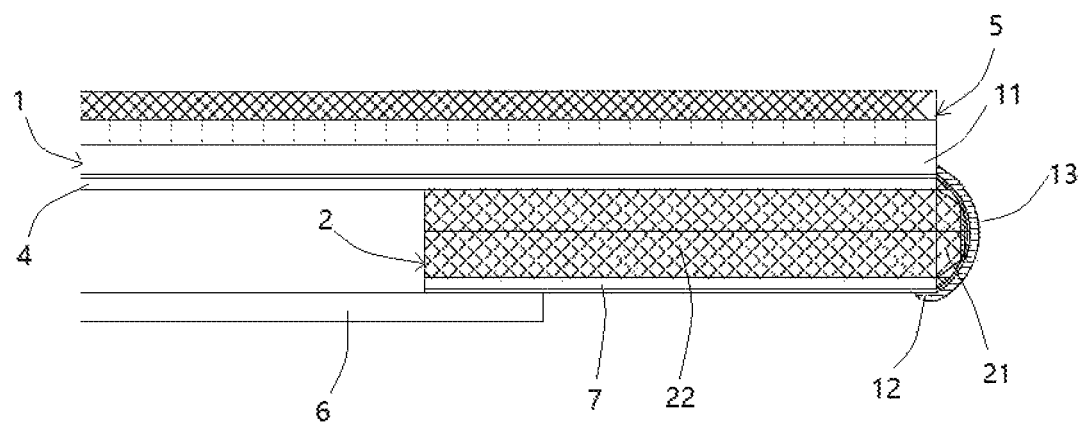
FIG. 1 is a schematic structural diagram of a display panel provided by an embodiment of the present disclosure.

A specific structural and functional details disclosed herein are merely representative and are used for the purpose of describing exemplary embodiments of the present disclosure. However, the present disclosure may be embodied in many alternative forms and should not be construed as being limited only to the embodiments set forth herein.

In descriptions of the present disclosure, it should be noted that, orientations or position relationships indicated by the terms, such as "center", "transverse", "upper", "lower", "left", "right", "vertical", "horizontal", "top", "bottom", "inside", "outside", etc. are based on the orientations or position relationships shown in the drawings. These are only convenience for describing the present disclosure and simplifying the descriptions, and does not indicate or imply that the device or element must have a specific orientation, a structure and an operation in the specific orientation, so it cannot be understood as a limitation on the present disclosure. In addition, the terms "first" and "second" are used for describing purposes only, and cannot be understood as indicating or implying relative importance or implicitly indicating the number of technical features indicated. Thus, the features defined as "first" and "second" may explicitly or implicitly include one or more of the features. In the descriptions of the present disclosure, the meaning of "plurality" is two or more, unless it is specifically defined otherwise.

In the present disclosure, the terms "mounting", "connected", "fixed" and the like should be broadly understood unless expressly stated or limited otherwise. For example, it may be fixed connected, removably connected, or integrated; it may be mechanically connected, or an electrically connected; it may be directly connected, or indirectly connected through an intermediary; it may be a connection between two elements or an interaction between two elements. For those skilled in the art, the specific meanings of the above terms in the present disclosure may be understood based on specific situations.

The terms used herein are for the purpose of describing particular embodiments only and is not intended to limit the exemplary embodiments. Unless the context clearly indicates otherwise, as used herein, the singular forms "a" and "an" are intended to include the plural. It should also be understood that the terms "including" and/or "comprising" as used herein specify the existence of stated features, integers, steps, operations, units and/or components, and without excluding the presence or addition of one or more other features, integers, steps, operations, units, components, and/or combinations thereof.

The present disclosure is further described below with reference to the drawings and embodiments.

As shown in FIG. 1, an embodiment of the present disclosure provides a display panel comprising a flexible substrate 1 and a supporting element 2. The flexible substrate 1 comprises a main portion 11, a bonding portion 12 bent on a back surface of the main portion 11, and a bending portion 13 connected to the main portion 11 and the bonding portion 12. Wherein, the main portion 11, the bonding portion 12, and the bending portion 13 are an integrally formed structure. The display panel comprises a display region, a bonding region, and a bending region between the display region and the bonding region. The main portion 11 is located in the display region, the bending portion 13 is located in the bending region, and the bonding portion 12 is located in the bonding region. Thicknesses of the bending portion 13 and the bonding portion 12 are generally less than a thickness of the main portion 11.

The supporting element 2 is disposed on a back surface of the flexible substrate 1, and comprises a first supporting portion 21. The bending portion 13 is curved. The first supporting portion 21 is disposed inside the bending portion 13 and contacts the bending portion 13. The first supporting portion 21 may be a polyhedron structure. At least one contact point may be defined between the first supporting portion 21 and the bending portion 13.

In the present embodiment, the first supporting portion 21 is used as a supporting element when the bending portion 13 is bent, that is, the bending portion 13 may be bent based on the first supporting portion 21 to realize a segmented bending of the bending portion 13, which prevents the bending portion 13 from being damaged by the extruded internal wiring, thereby effectively protecting the bending portion 13. Meanwhile, a size of the bending portion 13 may be reduced by adjusting a size of the first supporting portion 21, which reduces a bending radius, thereby reducing a thickness and screen ratio of the display panel.

Furthermore, as shown in FIG. 1, the supporting element 2 comprises a second supporting portion 22 connected to the first supporting portion 21, and the second supporting portion 22 is disposed between the main portion 11 and the bonding portion 12.

In the present embodiment, the bonding portion 12 bends on the back surface of the main portion 11, and the bonding portion 12 and the main portion 11 are mutually parallel. An interval is defined the bonding portion 12 and the main portion 11, and the second supporting portion 22 is fixed in the interval defined between the bonding portion 12 and the main portion 11. The first supporting portion 21 is connected to the second supporting portion 22, so that the first supporting portion 21 is fixed inside the bending portion 13 through the second supporting portion 22.

The second supporting portion 22 may be rectangular, and the first supporting portion may be a hexahedron structure. The hexahedron structure comprises a top surface, a bottom surface, and four sides respectively connected to the top surface and the bottom surface. The top surface contacts the bending portion 13, and the bottom surface is connected to the second supporting portion 22.

A size and a shape of a terminal surface of the second supporting portion 22 near the first supporting portion 21 exactly match a size and a shape of the bottom surface of the first supporting portion 21. The top surface and the bottom surface are rectangular, and the four sides are isosceles trapezoidal. An orthographic projection of the top surface of the first supporting portion 21 on the second supporting portion 22 is located in an orthographic projection of the bottom surface of the first supporting portion 21 on the second supporting portion 22.

Figure 2:
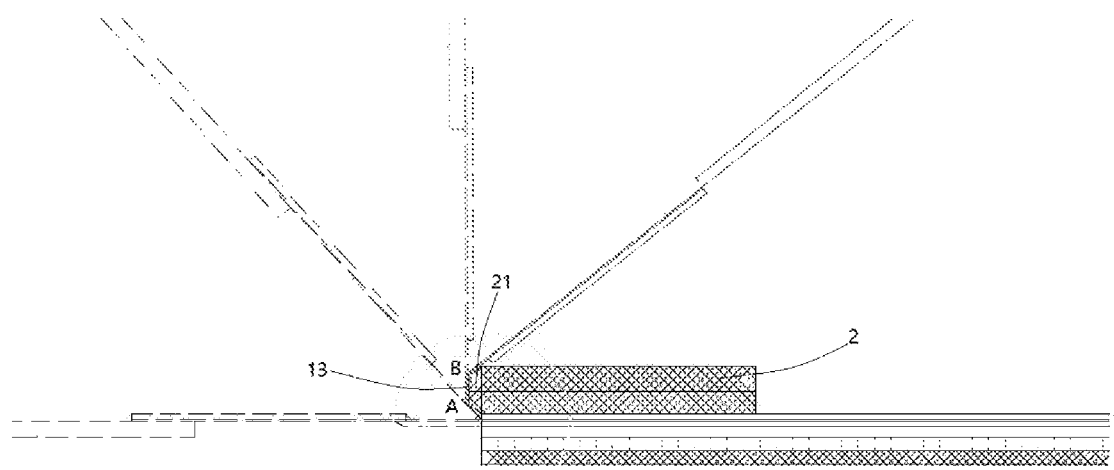
FIG. 2 is a schematic structural diagram of the display panel provided by the embodiment of the present disclosure when the display panel is in a bent state.

As shown in FIG. 2, the top surface and two opposite sides of the first supporting portion 21 comprise two joints, namely a first joint A and a second joint B. The bending portion 13 is first bent using the first joint A as a supporting point, and then is bent using the second joint B as a supporting point, that is, the bending portion 13 is divided into three sections to be bent, achieving an effect of the section bending and effectively protecting the bending portion 13.

In the bending portion 13, since the bending of a next section affects the bending of a previous section, an included angle between the four sides and the bottom surface ranges from 45° to 60°, so that when the bending portion 13 is bent at the first joint A and the second joint B, a transition is gentle and a magnitude of secondary deformation is reduced.

Figure 3:
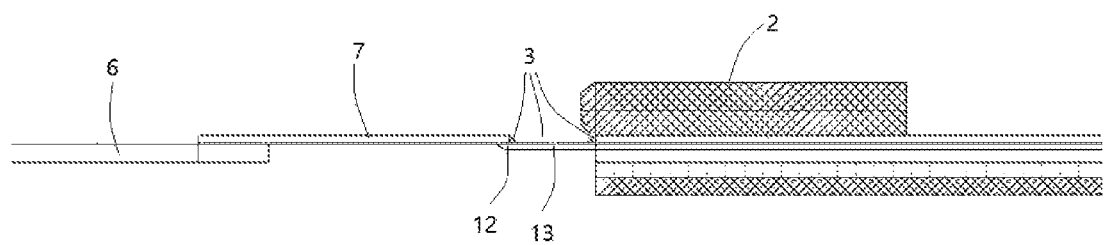
FIG. 3 is a schematic structural diagram of the display panel provided by the embodiment of the present disclosure when the display panel is in an expanded state.

Furthermore, as shown in FIG. 1, a shape formed by the bending portion 13 is a circular arc, and the first supporting portion 21 is a polyhedron structure. Thus, the bending portion 13 and the first supporting portion 21 are not completely fitted, that is, there is an interval between the bending portion 13 and the first supporting portion 21, and the interval is filled with a sealant 3. Wherein, as shown in FIG. 3, the sealant at both terminals of the bending portion 13 is filled in a form of dispensing, and other places are filled with the sealant. For example, a length of the bending portion 13 in an unfolded state is 1.9 mm, and the dispensing filled at each terminals of the bending portion 13 is 0.2 mm. The present disclosure improves the protective effect of the bending portion 13 by filling the sealant.

Figure 4:
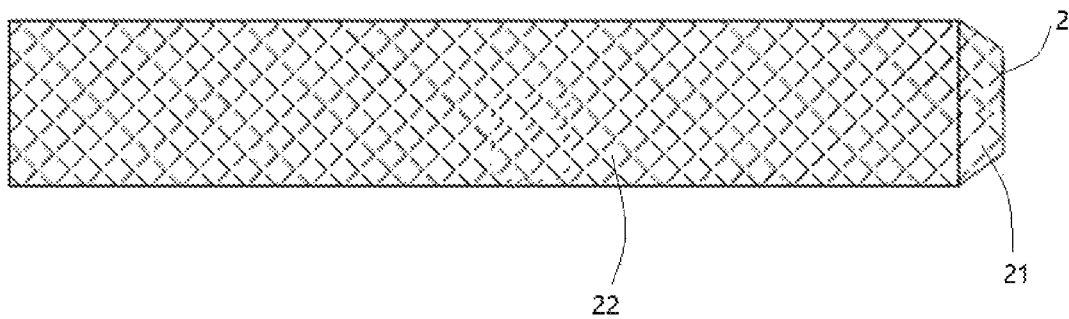
FIG. 4 is a schematic structural diagram of a supporting element in the display panel provided by the embodiment of the present disclosure.
Figure 5:
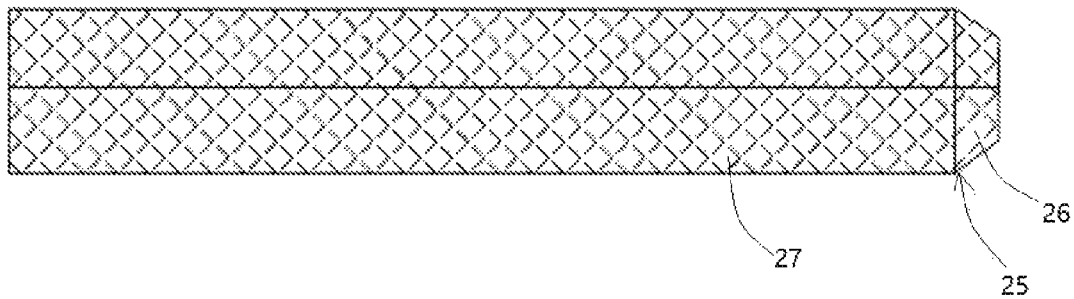
FIG. 5 is another schematic structural diagram of a supporting element in the display panel provided by the embodiment of the present disclosure.

In one embodiment, as shown in FIG. 4, the first supporting portion 21 and the second supporting port portion 22 in the supporting element 2 may be an integrally formed structure. In another embodiment, as shown in FIG. 5, the supporting element 2 is formed by splicing two identical supporting sub-elements 25. Each of the supporting sub-elements 25 comprises a first supporting sub-portion 26 and a second supporting sub-portion 27, and the first supporting sub-portion 26 and the second supporting sub-portion 27 in each of the supporting sub-elements 25 may be an integrally formed structure. Two first supporting sub-portions 26 of the supporting sub-element 25 may be spliced into the first supporting portion 21, and two second supporting sub-portions 27 of the supporting sub-element 25 may be spliced into the second supporting portion 22.

Furthermore, as shown in FIG. 1, the display panel further comprises a backboard 4, and the backboard 4 is disposed between the main portion 11 and the second supporting portion 22.

In the present embodiment, the backboard 4 is disposed on the main portion 11, and the second supporting portion 22 is disposed on the backboard 4 and the bonding portion 12, in order to fix the first supporting portion 21 on the bending portion 13, while preventing the display panel from extrusion, causing the internal wiring of the bending portion 13 to be damaged.

Furthermore, as shown in FIG. 1, the display panel further comprises an organic light-emitting diode (OLED) device 5, and the OLED device 5 is disposed at a side of the main portion 11 away from the bonding portion 12.

Furthermore, the display panel further comprises a flexible circuit board 6 and a chip on film (COF) substrate 7, and the flexible circuit board 6 is connected to the bonding portion 12 of the flexible substrate 1 through the COF substrate 7.

In the embodiment of the present disclosure, a supporting element is disposed on a back surface of a flexible substrate, and a first supporting portion of the supporting element is disposed inside a bending portion of the flexible substrate and contacts the bending portion. The first supporting portion is a polyhedron structure, so as to support the bending portion when the bending portion is bent, so that the bending portion can be bent in sections. It prevents damage to the bending portion due to extrusion, thereby effectively protecting the bending portion, while reducing the screen ratio and the thickness of the display panel.

Figure 6:
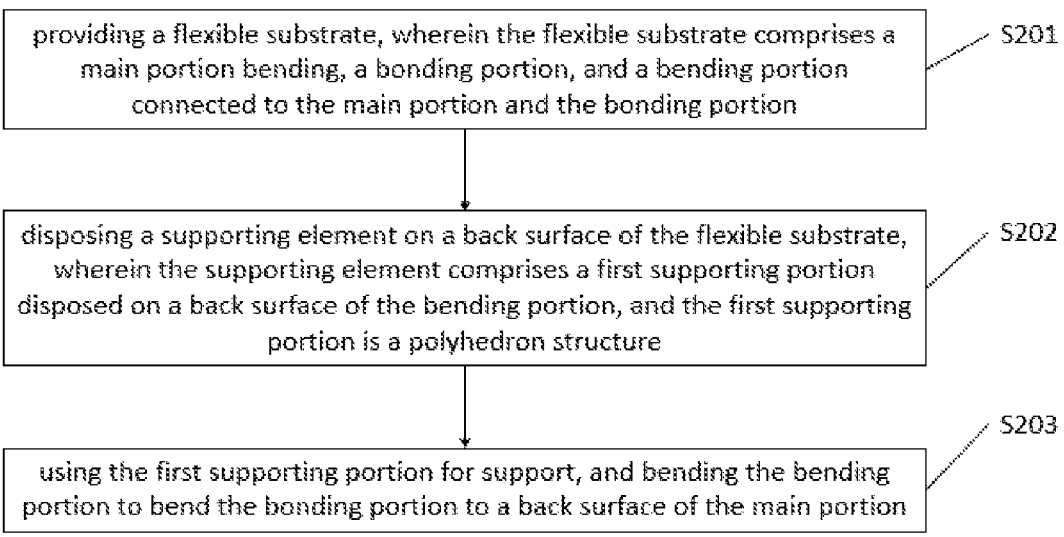
FIG. 6 is a flowchart of a manufacturing method of a display panel provided by the embodiment of the present disclosure.

As shown in FIG. 6, an embodiment of the present disclosure further provides a manufacturing method of a display panel. The manufacturing method comprises a step 201 of providing a flexible substrate, wherein the flexible substrate comprises a host portion, a bonding portion, and a bending portion connected to the host portion and the bonding portion.

In the present embodiment, as shown in FIG. 3, the flexible substrate 1 comprises the main portion 11, the bonding portion 12, and the bending portion 13. The main portion 11 is located in a display region of the display panel, the bending portion 13 is located in a bending region of the display panel, and the bonding portion 12 is located in a bonding region of the display panel. Thicknesses of the bending portion 13 and the bonding portion 12 are generally less than a thickness of the main portion 11.

After providing the flexible substrate 1, forming a backboard 4 on a back surface of the main portion 11 of the flexible substrate 1, and forming an organic light-emitting diode (OLED) device 5 on a front surface of the main portion 11. The bonding portion 12 of the flexible substrate 1 is connected to a flexible circuit board 6 through a chip on film (COF) substrate 7.

The manufacturing method further comprises a step 202 of disposing a supporting element on a back surface of the flexible substrate, wherein the supporting element comprises a first supporting portion disposed on a back surface of the bending portion, and the first supporting portion is a polyhedron structure.

In the present embodiment, as shown in FIG. 3, the supporting element 2 is disposed on the back surface of the flexible substrate 1, and the first supporting portion 21 of the supporting element 2 is disposed on the back surface of the bending portion 13. The supporting element 2 further comprises a second supporting portion 22, and the second supporting portion 22 is disposed on the back surface of the main portion 11, specifically, the second supporting portion is disposed at a side of the backboard 4 away from the main portion 11.

The manufacturing method further comprises a step 203 of using the first supporting portion for support, and bending the bending portion to bend the bonding portion to a back surface of the main portion.

In the present embodiment, as shown in FIG. 1, the first supporting portion 21 is disposed on the back surface of the bending portion 13 and near the main portion 11. The bending portion 13 is bent using the first supporting portion 21 for support to bend the bonding portion 12 to the back surface of the main portion 11. Therefore, the first supporting portion 21 contacts the bending portion 13, and the second supporting portion 22 is located between the backboard 4 and the bonding portion 12.

In the embodiment of the present disclosure, a supporting element is disposed on a back surface of a flexible substrate, and a first supporting portion of the supporting element is disposed inside a bending portion of the flexible substrate and contacts the bending portion. The first supporting portion is a polyhedron structure, so as to support the bending portion when the bending portion is bent, so that the bending portion may be bent in sections. This prevents damage to the bending portion due to extrusion, thereby effectively protecting the bending portion, while reducing the screen ratio and the thickness of the display panel.

As mentioned above, while the present disclosure has been disclosed via preferred embodiments as above, the preferred embodiments are not intended to limit the disclosure. Those skilled in the art can make various modifications and alternations without departing from the spirit and scope of the disclosure. The scope of protection of the disclosure is defined by the claims.

What is claimed is:

1. A display panel, comprising a flexible substrate and a supporting element, wherein the flexible substrate comprises a main portion, a bonding portion bent on a back surface of the main portion, and a bending portion connected to the main portion and the bonding portion;
   wherein the supporting element comprises a first supporting portion and a second supporting portion connected to the first supporting portion, the first supporting portion is a polyhedron structure disposed inside the bending portion and contacting the bending portion, and the second supporting portion is disposed between the main portion and the bonding portion; and
   wherein an interval is defined between the first supporting portion and the bending portion, and the interval is filled with a sealant.

2. The display panel as claimed in claim 1, wherein the polyhedron structure comprises a hexahedron structure, and the hexahedron structure comprises a top surface, a bottom surface, and four sides respectively connected to the top surface and the bottom surface; and
   the top surface contacts the bending portion, and the bottom surface is connected to the second supporting portion.

3. The display panel as claimed in claim 2, wherein the top surface and the bottom surface are rectangular, and the four sides are isosceles trapezoidal.

4. The display panel as claimed in claim 2, wherein an included angle between the four sides and the bottom surface ranges from 45° to 60°.

5. The display panel as claimed in claim 1, wherein the display panel comprises a backboard, and the backboard is disposed between the main portion and the second supporting portion.

6. The display panel as claimed in claim 1, wherein the display panel comprises an organic light-emitting diode (OLED) element, and the OLED device is disposed at a side of the main portion away from the bonding portion.

7. The display panel as claimed in claim 1, wherein the display panel comprises a flexible circuit board and a chip on film (COF) substrate, and the flexible circuit board is connected to the bonding portion of the flexible substrate through the COF substrate.

8. A display panel, comprising a flexible substrate and a supporting element, wherein the flexible substrate comprises a main portion, a bonding portion bent on a back surface of the main portion, and a bending portion connected to the main portion and the bonding portion; and
   wherein the supporting element comprises a first supporting portion and a second supporting portion connected to the first supporting portion, the first supporting portion is a polyhedron structure disposed inside the bending portion and contacting the bending portion, and the second supporting portion is disposed between the main portion and the bonding portion.

9. The display panel as claimed in claim 8, wherein the polyhedron structure comprises a hexahedron structure, and the hexahedron structure comprises a top surface, a bottom surface, and four sides respectively connected to the top surface and the bottom surface; and
   the top surface contacts the bending portion, and the bottom surface is connected to the second supporting portion.

10. The display panel as claimed in claim 9, wherein the top surface and the bottom surface are rectangular, and the four sides are isosceles trapezoidal.

11. The display panel as claimed in claim 9, wherein an included angle between the four sides and the bottom surface ranges from 45° to 60°.

12. The display panel as claimed in claim 8, wherein the display panel comprises a backboard, and the backboard is disposed between the main portion and the second supporting portion.

13. The display panel as claimed in claim 8, wherein the display panel comprises an organic light-emitting diode (OLED) element, and the OLED device is disposed at a side of the main portion away from the bonding portion.

14. The display panel as claimed in claim 8, wherein the display panel comprises a flexible circuit board and a chip on film (COF) substrate, and the flexible circuit board is connected to the bonding portion of the flexible substrate through the COF substrate.

* * * * *